United States Patent [19]

Sato

[11] 4,064,374
[45] Dec. 20, 1977

[54] COUPLING DEVICE FOR RADIO SET AND SMALL SIZE TAPE RECORDER

[75] Inventor: Masanobu Sato, Hachioji, Japan

[73] Assignee: Olympus Optical Co., Ltd., Tokyo, Japan

[21] Appl. No.: 643,374

[22] Filed: Dec. 22, 1975

[30] Foreign Application Priority Data

Dec. 28, 1974 Japan .................................. 50-3827
Dec. 28, 1974 Japan .................................. 50-3828
Dec. 28, 1974 Japan .................................. 50-3829

[51] Int. Cl.² ............................................. G11B 31/00
[52] U.S. Cl. ................................. 179/100.11; 360/137
[58] Field of Search ................... 179/100.11, 100.1 C; 360/137, 12; 325/311

[56] References Cited
U.S. PATENT DOCUMENTS

| | | | |
|---|---|---|---|
| 2,867,389 | 1/1959 | Viets | 179/100.11 |
| 3,400,227 | 9/1968 | Lear et al. | 179/100.11 |
| 3,646,278 | 2/1972 | Panizzi | 179/100.11 |
| 3,751,601 | 8/1973 | Wally | 179/100.11 |
| 3,899,795 | 8/1975 | Watanabe | 360/137 |
| 3,916,122 | 10/1975 | Sato et al. | 179/100.11 |

*Primary Examiner*—Raymond F. Cardillo, Jr.
*Attorney, Agent, or Firm*—Ostrolenk, Faber, Gerb & Soffen

[57] ABSTRACT

A coupling device for detachably coupling a radio set and a miniature tape recorder includes a pocket formed in one lateral side of the radio set so as to be displaceable between a first and a second position. A group of terminals are provided in the pocket for an electrical connection with another group of terminals formed in the tape recorder so that the electrical circuits of the both units are connected together automatically when the recorder is mounted in the pocket, thereby enabling transfer of an electrical signal therebetween. The coupling device also includes a switch which is physically mounted on the recorder and which is responsive to an operation of a record/playback button, the switch being connected through the groups of terminals to act as a power switch in the electrical circuit of the radio set. Another switch is provided in the radio set and is responsive to a displacement of the pocket between the first and the second position to control the operation of a recording microphone which is internally housed within the recorder.

6 Claims, 11 Drawing Figures

COUPLING DEVICE FOR RADIO SET AND SMALL SIZE TAPE RECORDER

BACKGROUND OF THE INVENTION

The invention relates to a coupling device for radio sets, in particular a portable radio set or car radio set, and a small size tape recorder, in particular a miniature cassette tape recorder which employs a micro-cassette.

A cassette tape recorder with a radio set incorporated therein is known which is provided with a tuner, a tape recorder portion, an amplifier, a loudspeaker and a power supply circuit. Such assembly is adapted to be used in every application, and is also adapted for portable use by the use of an internally housed battery source. As a result of recent developments which enabled a reduction in the cost of manufacturing, it has been extensively accepted in various fields. However, with this assembly, it is necessary to carry the entire assembly even if the user only desires a recording operation.

The present applicant has previously proposed a miniature cassette tape recorder for use with a micro-cassette of a size which is approximately one-quarter that of a conventional compact tape cassette which is usually employed in a casette tape recorder with an assembled radio set. The miniature cassette tape recorder is of a size which can be received in the pocket of a suit or shirt, thereby affording a great convenience to the portable use. An assembly which comprises a detachable combination of such a miniature cassette tape recorder and a radio set, in particular, a portable radio set which is equivalent in function to the above mentioned assembly, is also known.

An electroacoustic unit which comprises a detachable combination of a miniature cassette tape recorder and a portable radio set will be capable of operating as either a radio set or a tape recorder alone when they are coupled together or separated from each other; recording an output signal from the radio set by the tape recorder when they are coupled together; and reproducing an output from the tape recorder by the radio set when they are coupled together. Thus, it affords a convenience of allowing only the small size tape recorder to be carried about when a recording is desired, and additionally enables a high quality recording of an output from the radio set as well as a high fidelity reproduction of an output from a recorded tape by utilizing the amplifier and a high quality performance loudspeaker contained in the radio set, thus eliminating the above mentioned disadvantage of the conventional cassette tape recorder with assembled radio set.

In a conventional cassette tape recorder with an accompanying radio set, the radio portion and the recorder portion are integrally constructed, and therefore, there is provided a mode change-over switch which enables a radio function and a recorder function selectively. An input signal to the recorder is switched as the mode switch is operated. Specifically, when the mode switch is switched to a radio function, an output signal from the radio portion can be reproduced by the loudspeaker, and can also be recorded by the recorder portion. When the mode switch is switched to the recorder function, an output signal from the recorder portion can be reproduced by the loudspeaker or a voice signal from a microphone can be recorded. When recording a signal from the microphone during the record function mode, it is conventional to disable the loudspeaker in order to prevent the occurrence of a howling phenomenon. The mode switch which selects the function in the manner mentioned above can also be incorporated into the electroacoustic unit including a separable radio portion and recorder portion. In both instances, the switching operation is performed by a single switch of a small size, so that it is difficult to discern at a glance in which mode the cassette tape recorder with an accompanying radio set or the electroacoustic unit is placed, with the consequent possibility of inadvertently operating the switch to select a wrong input signal for recording, or picking up environmental noises instead of a voice which is to be recorded. In an attempt to overcome such difficulty, there has been proposed an arrangement which utilizes an automatic tape stop device contained within the cassette tape recorder with a combination of recorder and radio set to reset a tape drive mechanism and to return the mode change-over switch to the radio function automatically when a tape end is reached. However, such an arrangement is extremely complex and requires additional space, which stands in the way of miniaturization of the unit.

On the other hand, when recording an output from the radio portion by the recorder portion or reproducing an output from the recorder portion by the radio portion of the electroacoustic unit of the kind described above, only the recorder portion can be automatically stopped by the action of an automatic stop device at the termination of an intended operation while the radio portion must be deactuated by a manual operation. As a consequence, the user may inadvertently leave the radio portion in its operating state, causing unnecessary power dissipation.

To overcome this difficulty, the present applicant has previously proposed a power supply operating device for the electroacoustic unit of the kind described which permits the radio portion to be operated by an operating member contained within the recorder portion when both portions are coupled together. The power supply operating device comprises a movable contact of a power switch which projects externally of the radio portion so that it can be displaced by a sliding movement of a record/playback button, thus enabling the power switch in the radio portion to be operated by merely operating the recorder portion. In this manner, the entire unit can be easily operated.

However, with the above power supply operating device, it is necessary that the movable contact of the power switch in the radio portion be disposed so as to be engageable with the record/playback button in the recorder portion, thus imposing a severe restriction on the relative positioning of both portions. In addition, when both portions are separated, the movable contact of the power switch is externally exposed though only partially, whereby it is susceptible to deformation or damage.

In arrangement where a cassette tape recorder is incorporated into a car radio set, the recorder in most cases is only capable of a playback operation on a tape which is commercially available or which is specially prepared by the user on a separate tape recorder or cassette tape deck. Thus the user must have a cassette tape recorder for dedicated playback operation which is incorporated into the car radio set, and another cassette tape recorder which is usable elsewhere. The separate tape recorder capable of a recording operation is necessary if a recording is desired either within the car or when a destination is reached.

While a tape recorder capable of a recording within the car is proposed which employs a separate microphone, the limited length of the connection cord for the microphone restricts the distance which the location of the source of an acoustic signal can be picked up by the microphone. If it were possible for a car radio set to intercept a signal emitted by a wireless microphone unit and to pass it to the tape recorder which is assembled therewith for the purpose of recording, the extent within which the recording is available is again limited even though it is slightly increased.

Another problem with the combination of a radio and a recorder is the fact that when an audio signal from the radio is fed to a record input circuit of the tape recorder, the microphone internally housed within the latter is enabled since the recorder is in a record mode, so that extraneous sounds may also be picked up resulting in an unintended and desirable mixed recording. Such an inconvenience could be avoided by providing means which disables the internally housed microphone when the radio and recorder portions are coupled together. However, known means which disable the microphone is constructed to short-circuit the voltage source for the microphone, resulting in a complex and expensive arrangement because of its connection with other circuit arrangements.

SUMMARY OF THE INVENTION

It is a primary object of the invention to provide a coupling device for a radio set and a small size tape recorder in which a small size cassette tape recorder having a group of terminals can be detachably received in a pocket formed in one of the lateral side of the radio set which also includes a group of terminals for electrical connection with those provided on the body of the recorder, and in which, when a record mode is established for the recorder while the recorder is coupled with the radio set, a recording input signal to the recorder may be suitably switched depending on the position of the pocket.

It is another object of the invention to provide a coupling device for a radio set and a small size tape recorder in which the recorder is provided with a switch which is operated as a record/playback button thereof is depressed and which is connected through groups of terminals, provided on both the recorder and radio set, so as to act as a power switch of the radio set when the recorder is physically coupled with the radio set.

It is a further object of the invention to provide a coupling device for a car radio set and a miniature cassette tape recorder in which the recorder is detachably received in a pocket formed in one lateral side of the radio set.

It is an additional object of the invention to provide a coupling device for a radio set and a small size tape recorder which includes a switch connected with the output terminal of a microphone internally housed within the recorder so that it is closed to bypass the output from the microphone to the ground when the recorder is detachably coupled with the radio set.

In accordance with the invention, a pocket is formed in one lateral side of the radio set for receiving the small size tape recorder, and a group of electrical terminals are disposed within the pocket for the purpose of an electrical connection with the recorder. The pocket is displaceable between a first and second position relative to the body of the radio set. A switch is provided so as to be operated in response to a displacement of the pocket for disabling the microphone contained within the recorder in one position of the pocket. Thus, the pocket can assume an open position in which the recorder is capable of receiving a signal from the microphone and in which an output of the radio set is bypassed to the ground, and a closed position in which the recorder is capable of recording a signal from the radio set and in which the microphone is disabled. Such an arrangement is only possible when the radio set and the tape recorder are constructed as separable components, and permits the operational mode of the electroacoustic unit to be discerned at a glance, thus effectively avoiding an inadvertent operation.

A power switch is also provided for the radio set in accordance with the invention, and has no part which projects externally thereof, thus eliminating the likelihood of damage thereof caused by an externally applied force and thus maintaining a high reliability. The power switch can be used in combination with an automatic tape stop device so that the operation of the radio set is also disabled when the tape recorder is disabled from operation, thus avoiding the problem of unecessary power dissipation.

The coupling device according to the invention can also be applied to a car radio set so that a tape recorder may be detachably coupled therewith.

DETAILED DESCRIPTION OF PREFERRED EMBODIMENTS

Figure 1:
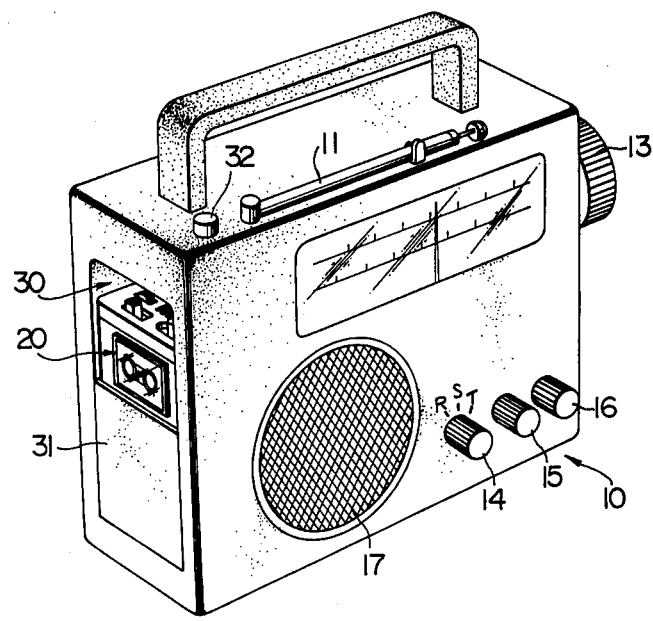
FIGS. 1 and 2 are perspective views of a coupling device constructed in accordance with one embodiment of the invention, FIG. 1 illustrating a first or closed position of a pocket in which a miniature cassette tape recorder is received, and FIG. 2 illustrating a second or open position of the pocket.
Figure 2:
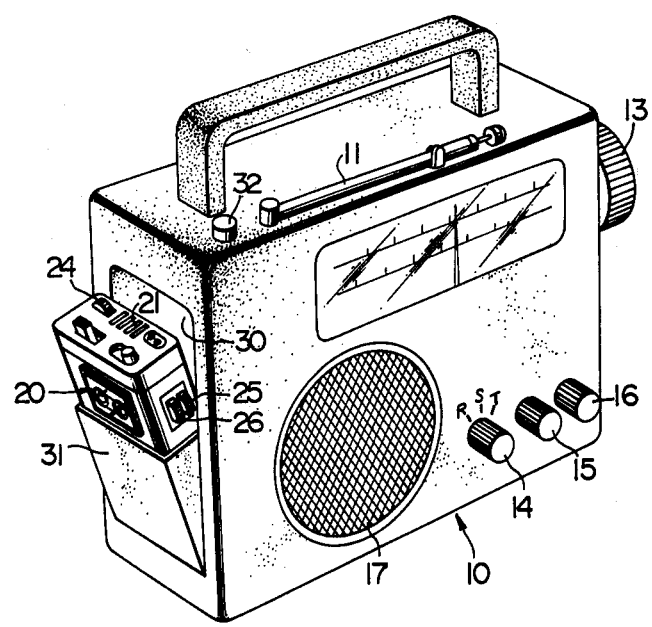
Figure 3:
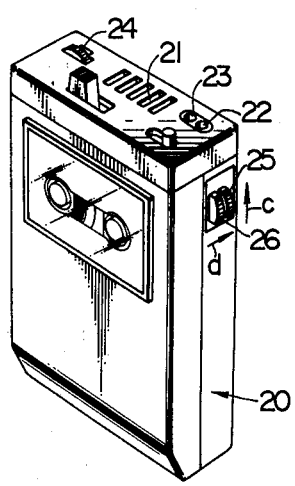
FIG. 3 is a perspective view of a miniature cassette tape recorder which may be received in the pocket of the radio set shown in FIGS. 1 and 2.

Referring to FIGS. 1 and 2, a radio set 10 is shown as including an antenna 11, a tuning dial 13, a tape/radio change-over switch 14, a tone control 15, a volume control 16 and a grille 17 for an internally housed loudspeaker. Referring to FIG. 3, a miniature cassette tape recorder 20 is shown as including a condenser microphone 21, a jack 22 for connection with an external microphone, an earphone jack 23, a volume control 24, a playback button 25 and a record button 26. The playback and record buttons 25, 26 are closely spaced from each other, and are constructed such that when the playback button 25 is moved in a direction indicated by arrow c, a playback mode of the recorder is established while when the record button 26 is moved in a direction indicated by arrow d, which is perpendicular to the first mentioned direction, into contact with the playback button 25 and then moved in the direction of the arrow c, a record mode for the tape recorder is established. The movement of these buttons 25, 26 controls a plurality of record/playback change-over switches 27a to 27e (see FIG. 7).

In accordance with the invention, a recess 30 having an opening of an area slightly greater than the major surface of the tape recorder 20 is formed in one lateral side of the radio set 10, as shown in FIGS. 1 and 2. A pocket 31 which detachably receives the recorder 20 is disposed within the recess 30 for pivotal movement about its lower end. Specifically, referring to FIGS. 5 and 6, a pushbutton 32 is disposed to extend through a top panel of the radio set 10 and is normally biased in an upward direction by a coiled spring 33. The lower end of the pushbotton 32 is secured to a sliding member 34 which is formed with an elongate guide slot 34a for engagement with a guide pin 35 mounted on the inner wall of the radio set 10 so as to permit a vertical movement of the member 34. The lower end of the sliding member 34 carries a detent pin 36 which is engaged by a notch 37a formed in the free end of a projection 37 which is secured to the top of the pocket 31. At its lower end, the pocket 31 is pivotally mounted at 38 and a coiled spring 39 is disposed between the bottom of the pocket 31 and the body of the radio set 10 so as to bias the pocket 31 toward the open position.

Figure 5:
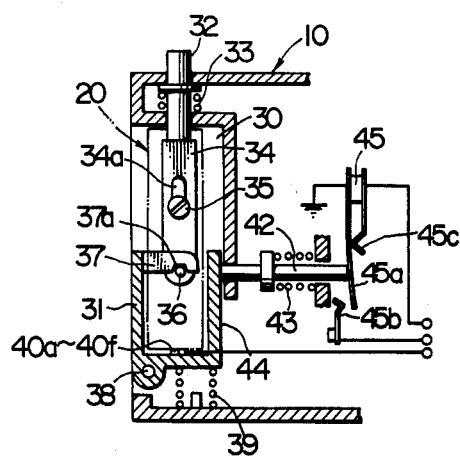
FIGS. 5 and 6 are schematic cross sections, illustrating the operation of the pocket.
Figure 6:
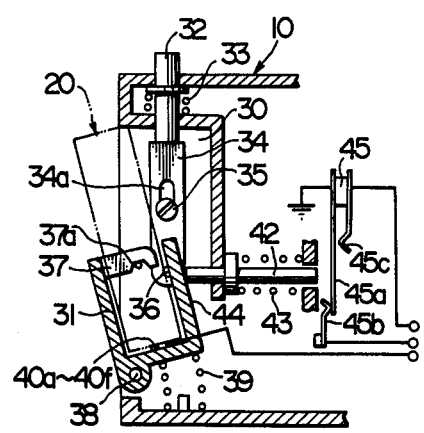

When the pushbotton 32 is depressed downward against the resilience of the coiled spring 33, the sliding member 34 moves downward while maintaining the engagement between its slot 34a and the guide pin 35 until the detent pin 36 is disengaged from the notch 37a, whereby the pocket 31 rotates counter-clockwise about the pivot 38 under the resilience of the coiled spring 39 (see FIGS. 2 and 6). When the pocket 31 in the open position is pushed back into the recess 30, the pocket 31 can be returned and locked in its initial position as shown in FIGS. 1 and 5, by engagement with the detent pin 36. In the description to follow, the position of the pocket 31 in which it closes the recess 30 (see FIGS. 1 and 5) will be referred to as a first position while its position shown in FIGS. 2 and 6 will be referred to as a second position. In the first position, the tape recorder 20 received in the pocket 31 has one-half of its major surface exposed externally and is completely received within the radio set 10. In the second position of the pocket 31, the microphone 21, the jacks 22, 23 and buttons 25, 26 are exposed and are accessible from the exterior.

Figure 4:
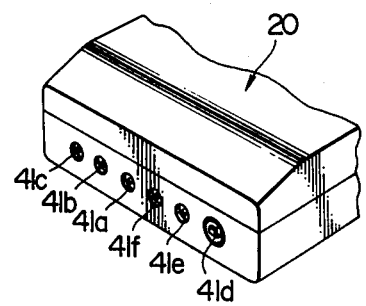
FIG. 4 is a fragmentary perspective view of the recorder, specifically illustrating a group of electrical terminals thereon.

To enable an electrical connection between the radio set 10 and the tape recorder 20, they are provided with a respective group of electrical terminals 40a to 40f and 41a to 41f, respectively, at positions which are located opposite to each other when they are coupled together. In the present embodiment, the radio set 10 includes a group of terminals 40a to 40f which are disposed in the bottom of the pocket 31 while a group of terminals 41a to 41f of the tape recorder 20 are disposed in the bottom surface thereof, that is in the surface which is opposite from the surface in which the microphone 21 is disposed, as shown in FIG. 4. The respective significance of the terminals will be described later.

As shown in FIGS. 5 and 6, the radio set 10 includes a plunger 42 which projects into the recess 30 and which is normally biased by a coiled spring 43 disposed thereon so that one end thereof bears against the rear wall of the pocket 31. This end of the plunger can be moved into or out of the recess 30 as the pocket 31 is opened or closed. The other end of the plunger 42 is maintained in abutment against a movable blade contact 45a of a change-over switch 45 which is disposed within the radio set 10. The blade contact 45a is connected with the ground, reference and in the open position of the pocket 31 in which the plunger 42 projects into the recess 30, one of the stationary contacts, 45b, of the switch is in contact with the blade contact 45a while in the closed position of the pocket 31 in which the plunger 42 is retracted from the recess 30, the other stationary contact 45c is in contact with the blade contact 45a. The contact 45b is connected with an amplifier circuit within the radio set 10 while the contact 45c is connected through the groups of the terminals with a power source circuit for the condenser microphone 21, which leads into the radio set 10.

Figure 7:
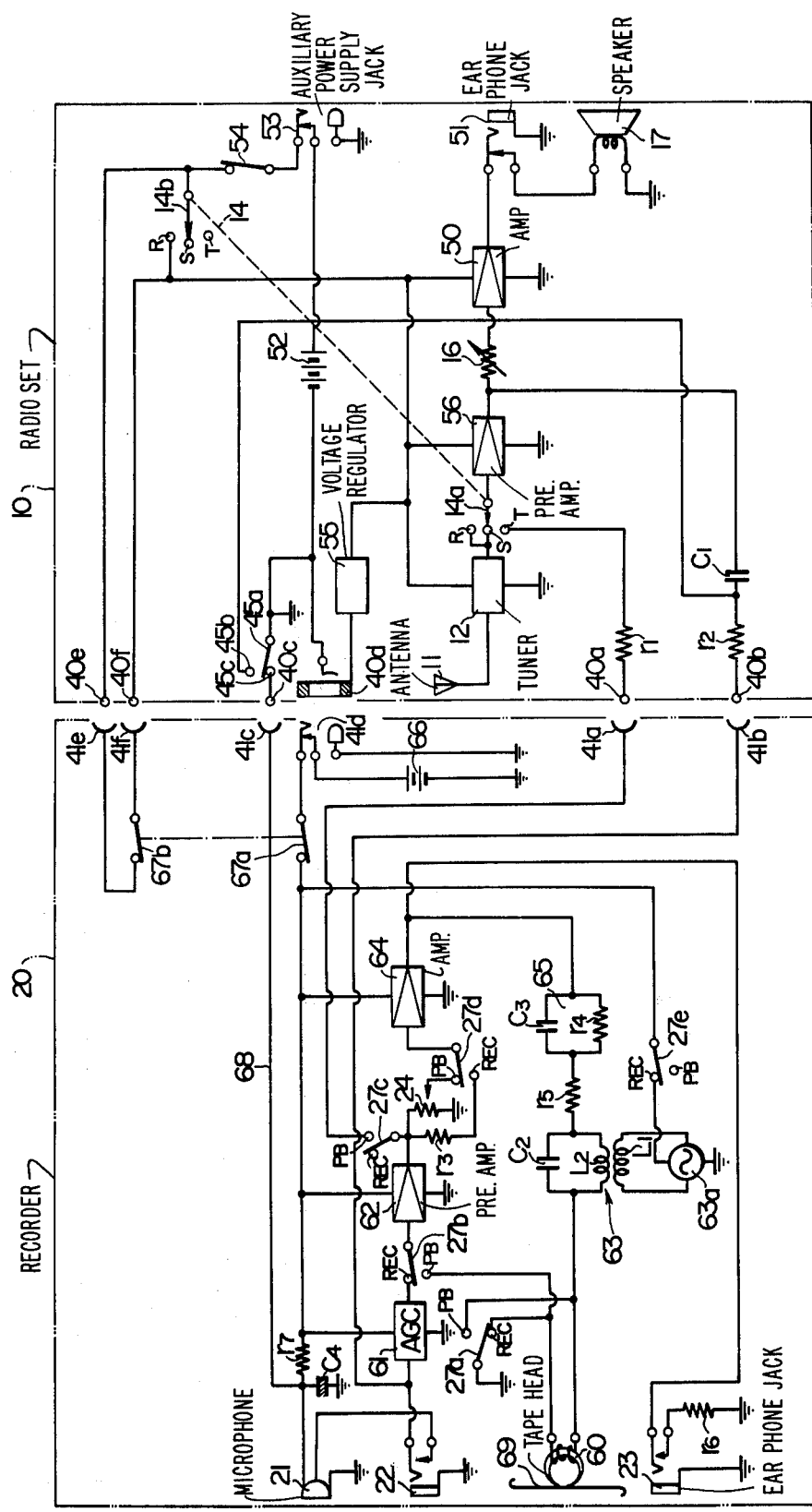
FIG. 7 is a circuit diagram of the electrical circuit formed by both the radio set and the recorder shown in FIGS. 1 and 2.

FIG. 7 is a circuit diagram of the electrical circuit formed by the radio set 10 and tape recorder 20. In this Figure, parts which have been mentioned previously are designated by like reference characters. The tape/radio change-over switch 14 is a double-pole, three-position switch having contacts R, S and T corresponding to a radio position, an automatic stop position and a tape position. Switch 14a has its contacts R and S connected together and connected with the tuner 12 while its contact T is connected through a resistor $r_1$ with the terminal 40a which mates with the terminal 41a of the tape recorder 10 for transfer of an output signal thereof. The volume control 16 controls the level of an input voltage to a main amplifier 50 which is connected with the loudspeaker 17 through an earphone jack 51. The loudspeaker 17 is disabled when an earphone plug (not shown) is inserted into the jack 51. The radio set 10 includes a source battery 52 which is connected through a jack 53 for an A.C. adaptor (not shown) and through a power (on/off) switch 54 with the terminal 40e. The terminal 40e is also connected with the movable contact of switch 14b having its stationary contact R connected with the terminal 40f and having its contacts S and T electrically isolated. The negative terminal of the battery 52 is connected with the electrical ground as is the blade contact 45a of the switch 45. The terminal 40c is connected with the stationary contact 45c. The terminal 40d is connected with a contact voltage regulator 55 to feed the recorder 20 from the battery 52 when it is coupled with the radio set 10. A pre-amplifier 56 is connected between the movable contact of the switch 14a and the volume control 16. The terminal 40b is connected through a resistor $r_2$ with the contact 45b, and is also connected through a capacitor $C_1$ with the junction between the output of the pre-amplifier 56 and the volume control 16. The contact R of the switch 14b is connected to feed the tuner 12, pre-amplifier 56 and main amplifier 50 from the source 52 and is also connected with the constant voltage regulator 55.

The plurality of record/playback change-over switches 27a to 27e provided in the tape recorder 20 are ganged together, and each have a movable contact which can be thrown to either record contact REC and a playback contact PB. Describing the function of the respective switches specifically, the switch 27a selectively enables a record and a playback operation of a record/playback head 60. The switch 27b supplies either an output signal from the microphone 21 or an output signal from the radio set 10 as transmitted through the terminals 40b, 41b to a pre-amplifier 62 through an AGC (automatic gain control) circuit 61 when its movable contact is thrown to the record contact REC, and supplies an output signal from the head 60 to the pre-amplifier 62 when its movable contact is thrown to the playback contact PB. The switch 27c supplies an output signal from the pre-amplifier 62 to the radio set 10 through the terminals 40a, 41a only during a playback mode. The switch 27d functions to maintain a fixed volume level through a resistor $r_3$ during a record mode and to provide an adjustable volume level during a playback mode by means of the volume control 24. The switch 27e functions to feed power to a bias oscillator circuit 63 comprising an oscillator 63a, a pair of coupling coils $L_1$, $L_2$ and a capacitor $C_2$ only during a record mode. A main amplifier 64 has its input connected with the movable contact of the switch 27d and has its output connected with an equalizer 65 which comprises a resistor $r_4$ and a capacitor $C_3$ connected in parallel and also connected with the jack 23 in series with a resistor $r_6$. A battery 66 feeds the AGC circuit 61, the pre-amplifier 62 and the main amplifier 64 through a power switch 67a. A conductor 68 is connected with the terminal 41c to feed the microphone 21 from the source within the radio set 10 when it is coupled with the tape recorder 20. A filter comprising a shunt capacitor $C_4$ and a series resistor $r_7$ is connected between the conductor 68 and one terminal of the power switch 67a.

In accordance with the invention, a switch 67b, which is ganged with the power switch 67a, is provided within the tape recorder 20, and has its opposite contacts connected with the terminals 41e, 41f, respectively, which are in turn connected with the terminals 40e, 40f on the radio set 10 when the recorder is coupled with the radio set, so that this switch is connected in shunt with the switch 14b provided within the radio set 10. The pair of switches 67a, 67b are operated in response to a displacement of the record and playback buttons 25, 26 provided on the tape recorder 20, in the first direction indicated by the arrow c (see FIG. 3). As a result, when the power switch 54 of the radio set 10 is closed, if the movable contact of the mode change-over switch 14b is thrown away from the contact R, the switch 67b within the tape recorder 20, which remains closed as long as the tape recorder 20 is in operative condition, permits the power supply circuit of the radio set 10 to be connected so as to feed both the electrical circuit of the radio set 10 and that of the tape recorder 20. The connection between the tape recorder 20 and the radio set 10 is maintained in the second or open position of the pocket 31 (see FIGS. 2 and 6) unless the tape recorder 20 is withdrawn therefrom.

The operation of the electrical circuit, in particular, the function of the change-over switch 45 as the pocket 31 is opened and closed, will be described below. In the open position of the pocket 31, the change-over switch 45 assumes the condition illustrated in FIG. 6. Specifically, the movable blade contact 45a is maintained in contact with the stationary contact 45b, and away from the other stationary contact 45c. Under this condition, a playback operation of the tape recorder 20 by using an earphone, as well as a recording operation with the internally housed condenser microphone 21 or an external microphone (not shown) connected with the microphone jack 22 is possible. In this position, the contact 45b is connected with the ground through the contact 45a, whereby the battery 52 within the radio set 10 feeds the microphone 21 through the terminals 40d, 41d, and since the contact 45c is removed from the blade contact 45a, the terminal 41c which is connected with the terminal 40c remains isolated, preventing the electrode of the microphone 21 from being connected with the ground. As a consequence, an output signal from the microphone 21 is applied to the AGC circuit 61, the pre-amplifier 62, the main amplifier 64 and the equalizer 65, in turn, and an output signal from the equalizer 65 is superimposed with a bias current which is produced by the bias oscillation circuit 63 before it is supplied to the head 60, thus producing a recording on a magnetic tape 69. At this time, the blade contact 45a is connected with the contact 45b, whereby an output from the tuner 12 of the radio set 10 is connected with the ground, preventing interference between an output from the microphone 21 and an output from the tuner 12 even if the switch 14 is thrown to the contact R. When the switch 14 is thrown to the contact R, an output from the amplifier 56 is connected with the ground through the capacitor $C_1$ and the switch 45, so that the loudspeaker 17 cannot be driven. When the switch 14 is thrown to the contact T, the switch 27c prevents an output of the pre-amplifier 62 from being transmitted to the radio set 10 during a record mode, thus effectively preventing the occurrence of a howling phenomenon.

In the open position of the pocket 31, it is impossible to record an output from the tuner 12 since such output is connected with the ground through the contacts 45a, 45b of the switch 45. Also in this position of the pocket 31, a playback operation of the tape recorder 20 in combination with the loudspeaker 17 is disabled since an output from the amplifier 56 is shunted to the ground through the contacts 45a, 45b of the switch 45 if the switch 14 is thrown to the contact T to supply an output of the tape recorder to the amplifier 56. In this position, a playback operation of the tape recorder 20 is only possible by the use of an earphone, not shown, which is connected with the earphone jack 23. Thus it will be seen that the second or open position of the pocket 31 corresponds to a recording operation of the tape recorder 20 while using either microphone.

In the closed position of the pocket 31, the movable blade contact 45a is moved away from the contact 45b and into contact with the other stationary contact 45c. As a consequence, a recording by the tape recorder 20 of the signal intercepted by the radio set 10 as well as a reproduction by the radio set 10 of an output from the tape recorder 20 are both possible.

A radio signal intercepted by the antenna 11 and the tuner 12 will be fed through the switch 14 to the pre-amplifier 56, and thence through the volume control 16 to the main amplifier 50 which feeds the loudspeaker 17. At the same time, an output from the pre-amplifier 56 is fed through the capacitor $C_1$, the resistor $r_2$, and the pair of terminals 40b, 41b to be applied to the AGC circuit 61 in the tape recorder 20. Since the blade contact 45a is thrown to the contact 45c which is connected with the terminal 40c and hence with the terminal 41c, no operating voltage can be applied to the microphone 21, which therefore produces no output, allowing only the output signal from the radio set 10 to be supplied to the AGC circuit 61. The AGC circuit 61 then feeds the pre-amplifier 62, and the following circuit operates in the same manner as mentioned previously to perform a recording operation.

The output signal from the tape recorder 20 can be reproduced by the radio set 10 in the following manner: A signal recorded on the magnetic tape 69 is picked up by the magnetic head 60, the switch 27a being thrown to the contact PB at this time. The signal picked up by the head 60 is supplied through the switch 27b to the pre-amplifier 62, which in turn feeds the main amplifier 64 for driving the earphone. However, when the recorder is coupled with the radio set 10, and the switch 27c is thrown to the contact PB, the output of the pre-amplifier is supplied to the contact T of the switch 14a through the terminals 41a, 40a, so that the output from the tape recorder 20 may be supplied to the pre-amplifier 56 and the main amplifier 50 to be reproduced by the loudspeaker 17 if the switch 14a is thrown to the contact T.

In the closed position of the pocket 31, the switch 45 assumes the position shown in FIG. 5, so that an output of the pre-amplifier 56 is supplied through the terminals 40b, 41b to the AGC circuit 61 of the tape recorder 20. When the record button 26 is initially moved in the direction of the arrow d into contact with the playback button 25 and then moved together in the direction of the arrow c, all of the switches 27a to 27e are thrown to the contact Rec. As a consequence, the tape recorder 20 is switched to a record mode, whereby an output from the radio set 10 can be recorded by the recorder 20. When an automatic stop device to be described later is incorporated into the tape recorder, the mechanical parts of the recorder 20 will be reset when an end of the magnetic tape 69 is reached. As a result, the record and playback buttons 25, 26 are reset to their initial positions, and hence the power switch 67a which is interlocked with these buttons is opened to deenergize the recorder 20.

When the mode change-over switch 14a is thrown to the contact S, the switch 14b is also thrown to the contact S. As a consequence, the power source 52 within the radio set 10 does not feed the radio set 10 and the tape recorder 20 under this condition if the power switch 54 is closed, unless the switch 67b located within the tape recorder 20 is closed. As mentioned previously, the switch 67b is operated automatically in response to the operation of the mechanism within the tape recorder 20. In other words, when the switch 14a is thrown to the contact S, the power supply 52 within the radio set 10 will be turned on or off depending on the operative condition of the tape recorder 20.

A recording with the microphone 21 is possible independently of the position of the mode change-over switch 14, by opening the pocket 31 to its second position.

Figure 8:
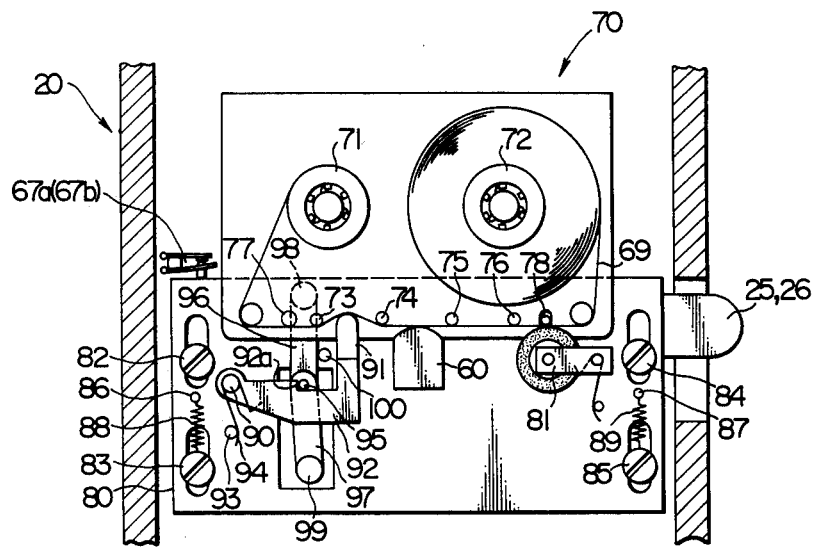
FIGS. 8 and 9 are plan views of one example of an automatic stop device which may be incorporated into the tape recorder.
Figure 9:
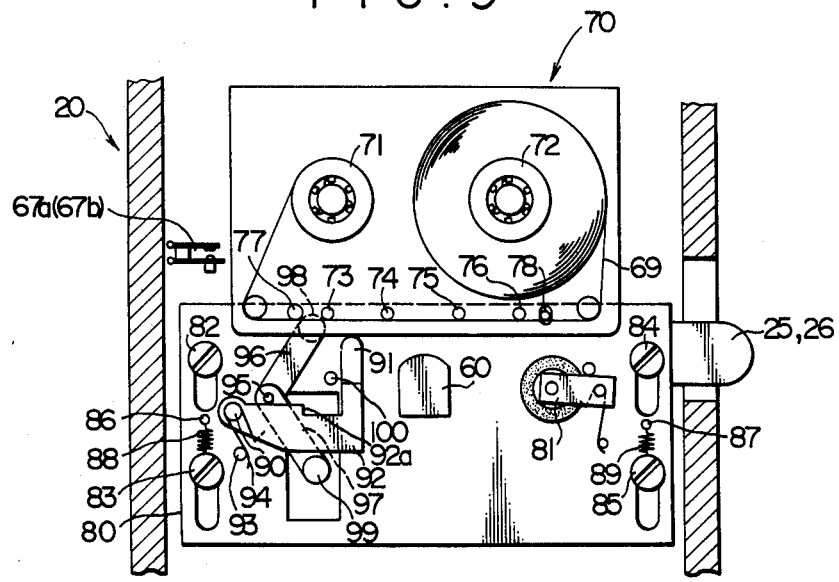

FIGS. 8 and 9 show the record/playback condition and the stop condition of an automatic stop device which may be advantageously incorporated into the coupling device according to the invention. A tape cassette 70 is shown as including a length of magnetic tape 69 which is disposed on a pair of tape hubs 71, 72 rotatably disposed therein. A plurality of tape guide pins 73, 74, 75 and 76 are shown along one lateral edge of the cassette 70. A pair of apertures 77, 78 are shown for receiving a capstan. The tape recorder 20 includes a sliding plate 80 on which the record and playback buttons 25, 26 are secured and also carrying the magnetic head 60 and a pinch roller support arm 81. The sliding plate 80 is formed with pairs of slots adjacent to its lateral sides, which are engaged by studs 82, 83, 84, 85 which are secured to a chassis (not shown) of the tape recorder, whereby it can be moved toward or away from the tape cassette 70 in response to an operation of the record or playback button 25, 26. Adjacent to the studs 83 and 85, the sliding plate 80 has a pair of pins 86, 87 fixedly mounted thereon, and a pair of tension springs 88, 89 have their ends engaged with these pins and the studs so as to normally bias the sliding plate 80 in a direction away from the tape cassette 70. However, during a record/playback mode, the sliding plate 80 is retained in position by a linkage to be described below.

A pivot 90 is mounted on the sliding plate 80, and pivotally carries one end of an L-shaped lever 92 carrying a tape contacting piece 91 at its free end. A spring 94 is disposed on the pivot 90, and has its one end engaged with a staionary pin 93 on the sliding plate while its other end is engaged with the underside of the lever 92, thus gently biasing it to rock counter-clockwise. A pair of links 96, 97 are interconnected on a pin 95, and the other end of the link 96 is connected with the sliding plate 80 by means of a pin 98 while the other end of the link 97 is connected with the chassis mentioned above by a pin 99. A stop 100 is provided on the sliding plate 80 to limit angular movement of the links beyond their dead center. The sliding plate 80 is retained in position during a record/playback mode as a result of the pin 95 of the linkage being engaged by a step 92a formed in the lateral side of the lever 92 when the linkage assumes or is in the vicinity of its dead center position. At this time, the switches 67a, 67b which are located in the path of movement of the sliding plate 80 are closed.

When an end of the tape 69 is reached, the tension in the tape urges the contacting piece 91 downward, whereby the pin 95 of the linkage is disengaged from the step 92a. Thereupon, the sliding plate 80 is pulled in the downward direction under the resilience of the springs 88, 89, returning the mechanical parts of the tape recorder 20 to a stop position shown in FIG. 9. At the same time, the switches 67a, 67b are opened.

Figure 10:
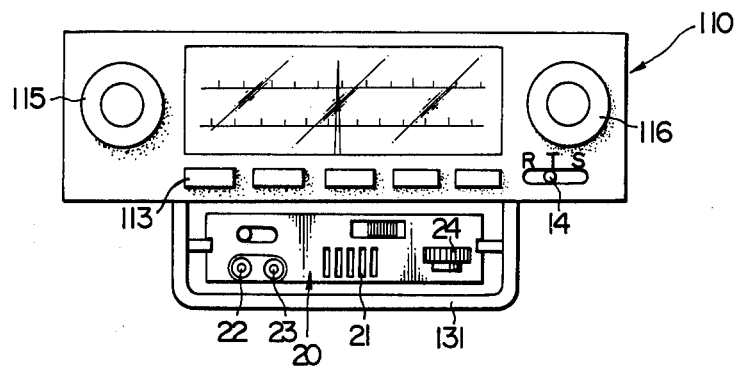
FIG. 10 is a front view of a coupling device for a car radio set and a small size cassette tape recorder which is constructed in accordance with another embodiment of the invention.

FIG. 10 shows a car radio set 110 which is coupled with a miniature cassette tape recorder such as shown at 20 in FIGS. 3, 4 and 7. At its bottom, the car ratio set 110 is provided with a pocket 131 in which the tape recorder 20 can be detachably received. In its innermost end, the pocket 131 is provided with a group of electrical terminals for connection with a group of corresponding terminals provided on the part of the tape recorder 20. However, because the arrangement of these groups of terminals are similar to those described above in connection with FIG. 7, their arrangement and operation will not be specifically described here again. The car radio set 110 is provided with a plurality of station selecting buttons 113 which substitute for the tuning dial mentioned previously. In addition, the front panel of the car radio set 110 is provided with a mode change-over switch 114, a volume control 115 and a tone control 116. However, it should be noted that the pocket 131 is not displaceable between a first and second position as the pocket 31 of the radio set 10 (see FIGS. 1 and 2) is constructed. Hence a recording operation by the tape recorder 20 takes place by the recorder alone. A playback signal from the tape recorder 20 can be reproduced by the radio set 110, and a signal intercepted by the car radio set 110 can be applied to the AGC circuit 61 of the tape recorder 20, and hence can be recorded. Thus, all operations other than a recording operation by the recorder alone can be similarly performed as when the recorder 20 is coupled with the radio set 10, and when a recording operation is desired, the recorder 20 is taken out of the pocket 131 to perform a recording operation by itself. An advantage gained by coupling the recorder 20 with the car radio set 110 is the capability of utilizing the car battery as the power source 52.

Figure 11:
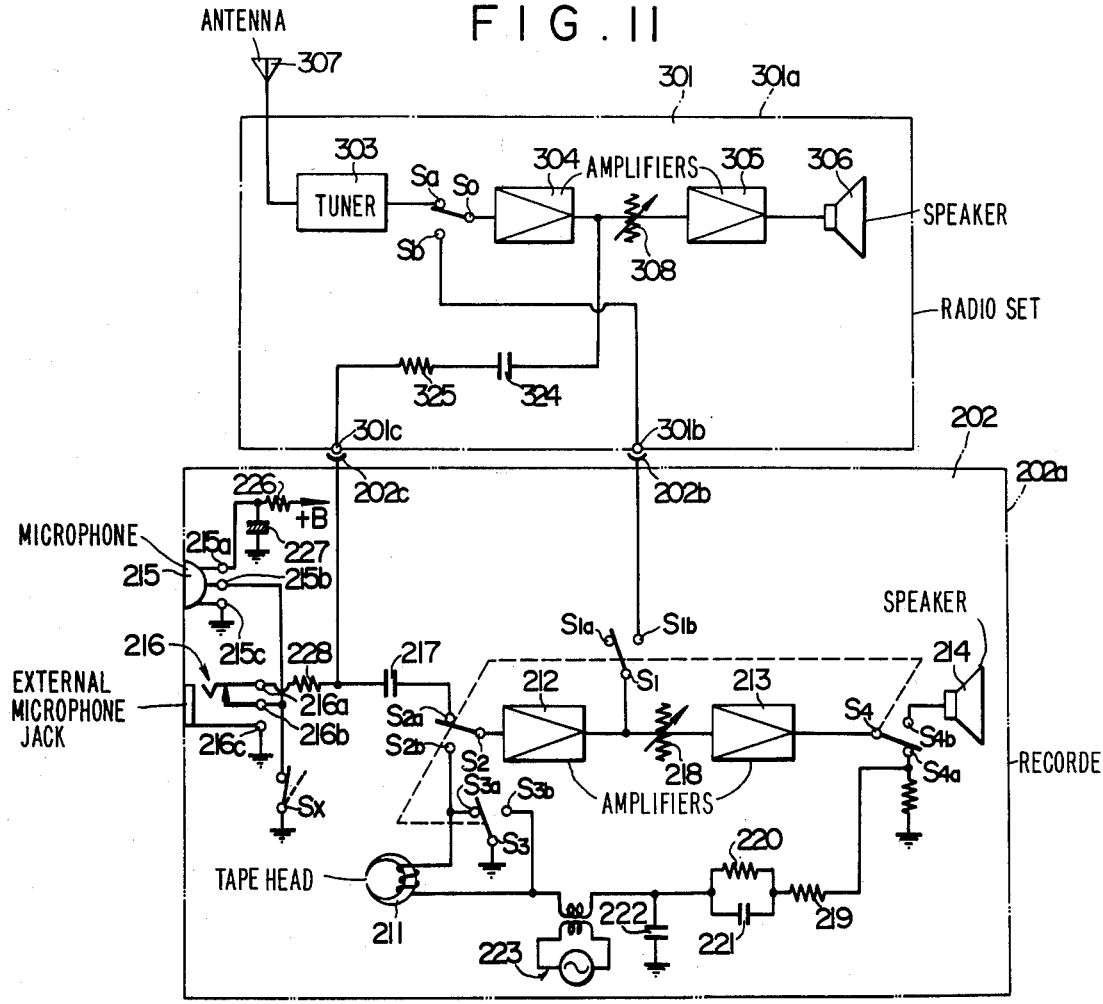
FIG. 11 is a circuit diagram of an arrangement in which the output of an internally housed microphone is connected with the ground reference when recording a signal from the radio set.

FIG. 11 shows an embodiment in which the operation of a microphone is disabled as a radio signal is recorded while the tape recorder 20 is coupled with either radio set 10 or car radio set 110. In FIG. 11, a block 301a enclosed by single dot chain lines represents the electrical circuit of a radio set 301 while a block 202a enclosed by double dot chain lines represents the electrical circuit of a tape recorder 202. The electrical circuit of the radio set 301 is conventional and is shown as comprising a tuner 303, an amplifier 304, a power amplifier 305 and a loudspeaker 306. A signal voltage intercepted by an antenna 307 is selected by the tuner 303 and is passed through a change-over switch $S_O$ to the amplifier 304, the output of which is applied to a volume control 308 before being fed to the power amplifier 305, which in turn drives the loudspeaker 306 so as to produce an audible output.

When functioning as a radio set in this manner, the movable contact of the switch $S_O$ is thrown to one of its stationary contacts, $Sa$. However, the amplifier circuit within the radio set 301 may be utilized as a playback amplifier associated with the tape recorder 302 when the switch $S_O$ is thrown to the other stationary contact $Sb$ and respective switches $S_1$, $S_2$, $S_3$ and $S_4$ contained within the electrical circuit of the tape recorder 202 are thrown to stationary contacts $S_1b$, $S_2b$, $S_3b$ and $S_4b$, respectively. Specifically, the stationary contact $Sb$ of the switch $S_O$ is connected with an electrical terminal 301b provided within the radio set 301. The stationary contact $S_1b$ of the switch $S_1$ which is provided on the tape recorder 202 is connected with an electrical terminal 202b which is located for mating engagement with the electrical terminal 301b when the recorder is coupled with the radio set. Thus, when the units 301, 202 are coupled together, the contacts $Sb$ and $S_1b$ are connected together, whereby an output signal reproduced from a magnetic tape is partly applied to the input of the amplifier 304 in the radio set 301, which therefore functions as a playback amplifier for the tape recorder 202. The electrical circuit of the tape recorder 202 is also conventional, and is shown as comprising a record/playback head 211, amplifiers 212, 213, a loudspeaker 214, an internally housed microphone 215 and a jack 216 for connection with an external microphone. During a record mode, the change-over switches $S_1$ to $S_4$ are thrown to the other stationary contacts $S_1a$ to $S_4a$, respectively, as shown.

Thus, when performing a recording operation with the use of a microphone, an output signal from the internal microphone 215 or from an external microphone (not shown), which is connected with the jack 216, is coupled through a capacitor 217 and switch $S_2$ to the amplifier 212, the output of which is connected with a variable resistor 218 which functions to adjust the magnitude of an input to the amplifier 213. The output of the amplifier 213 is fed through switch $S_4$, resistor 219, a parallel connection of resistor 220 and capacitor 221, and through a bias circuit comprising an oscillator 223 to the head 211. A shunt capacitor 222 is connected between the junction between the bias circuit and the parallel connection and the ground.

When recording an audio signal from the radio set 301, the tape recorder 202 is physically coupled with radio set 301, whereby an electrical terminal 301c on the radio set 301 is electrically connected with an electrical terminal 202c on the tape recorder 202. Part of the output of the amplifier 304 in the radio set 301 is applied through a capacitor 324 and a resistor 325, connected in series, and through the capacitor 217 to the stationary contact $S_2a$ of the switch $S_2$ which is connected with the input of the amplifier 212.

The microphone 215 which is internally housed within the tape recorder 202 includes a terminal 215a to which an operating voltage is applied, a common terminal 215b, and a grounded terminal 215c. The terminal 215a is connected through a resistor 226 with a +B source, with a shunt capacitor 227 connected between the terminal 215a and the ground. The common terminal 215b is connected with a movable conductive piece 216b of the jack 216, and the terminal 15c is connected with the ground. In addition to the movable piece 216b, the jack 216 also includes another movable conductive piece 216a and a grounded terminal 216c. The movable piece 216b is normally maintained in contact with the conductive piece 216a, but is moved away therefrom when the plug of an external microphone is inserted into the jack 216. The conductive piece 216a is connected through a resistor 228 with the capacitor 217, which forms a record input circuit of the tape recorder. The terminal 216c is connected with the ground. A normally open switch $Sx$ is connected between the movable conductive piece 216b and the ground, and is closed when the tape recorder 202 is physically coupled with the radio set 301.

Thus, when the recorder 202 is physically coupled with the radio set 301, the switch $Sx$ is closed, whereby the common terminal 215b, which represents the output terminal of the internally housed microphone 215, is shortcircuited to the ground, preventing an output signal from the microphone 215 from being transmitted to the record input circuit. Thus, only an audio signal from the radio set 301 is transmitted to the record input circuit. The resistor 228 connected in series with the conductive piece 216a prevents a signal to be recorded which is supplied from the radio set 301 from being bypassed to the ground through the conductive piece 216b. A mixed recording is enabled at this time by the use of an external microphone which is connected with the jack 216.

What is claimed is:

1. Apparatus including a radio and a miniature tape recorder, said radio and tape recorder each being capable of independent operation and operation as an integral unit, said apparatus comprising:
   A. a radio operable in a radio or tape mode, said radio including:
      1. radio receiver means for converting radio signals into electrical signals;
      2. a speaker for converting electrical signals into acoustical signals;
   B. a miniature tape recorder operable in a record or playback mode, said tape recorder including:
      1. magnetic tape head means for converting electrical signals applied thereto into magnetic signals to be applied to a magnetic tape head when said tape recorder is in said record mode and for converting magnetic information stored on a magnetic tape into electrical signals when said tape recorder is in said playback mode;

2. a microphone for converting acoustical signals into electrical signals;

C. coupling means for mechanically and electrically coupling said tape recorder to said radio when said tape recorder and radio are to be operated as a single integrated unit, said coupling device including a pocket formed on one lateral side of said radio and adapted to receive said recorder, said pocket being movable between a first position wherein it is closed and a second position wherein it is open;

D. switch means responsive to movement of said pocket from said first to said second position, said switch means:

1. disabling said microphone and applying said electrical signal generated by said receiver to said tape head when said pocket is in said first position, said radio is in said tape mode and said recorder is in said record mode;

2. disabling said microphone and applying said electrical signal generated by said tape head to said speaker when said pocket is in said first position, said radio is in said tape mode and tape recorder is in said playback mode; and 3. enabling said microphone and applying said electrical signals generated by said microphone to said tape head when said pocket is in said second position and said tape recorder is in said record mode.

2. Apparatus as in claim 1, wherein said switch means includes a two position switch movable between a first position wherein it grounds the output of said microphone when said pocket is in said first position and a second position wherein it grounds the output of said radio receiver means when said pocket is in said second position.

3. A coupling device according to claim 1 in which the pocket is displaceably disposed in a recess which is formed in one lateral side of the radio set, the pocket being entirely received within the recess in its first position and being tilted to be partly exposed externally in its second position in which a withdrawal of the recorder from the pocket is permitted.

4. Apparatus as in claim 1 wherein said radio and recorder are each provided with a group of electrical terminals adapted to be electrically connected together when said recorder is physically coupled to said radio, characterized by the provision of a switch mounted within the tape recorder and adapted to be operated in response to an operation of a record/playback button thereof, said switch being connected to serve as a power switch of the radio set through the groups of electrical terminals when the recorder is physically coupled with the radio.

5. A tape recorder and a radio set each capable of independent operation and each having a group of electrical terminals releasably connectable with each other; said radio set having a portable power supply contained therein; said radio set including a receiver and an electrical power circuit path for coupling the power supply to the receiver;

normally open switch means contained in said recorder and being electrically connected to said power circuit path through selected ones of said terminal groups when said recorder and radio set are joined;

means for closing said switch means when said tape recorder is placed in a record or playback mode; and means for sensing the approach of one end of the tape and for opening said switch means when said one end of the tape has been reached.

6. The apparatus of claim 5, wherein said switch means further includes second switch means for coupling the tape recorder to the radio set power supply, said second switch means being adapted to be operated to the same position as said normally open switch means by said sensing means.

* * * * *